United States Patent
Nikitin et al.

(10) Patent No.: US 6,982,138 B2
(45) Date of Patent: Jan. 3, 2006

(54) METHOD OF CONTROLLING REMOVAL OF PHOTORESIST IN OPENINGS OF A PHOTORESIST MASK

(75) Inventors: Arkady Nikitin, Yonkers, NY (US); Dmitriy Yeremin, Dobbs Ferry, NY (US)

(73) Assignee: General Phosphorix, LLC, Ardsley, NY (US)

( * ) Notice: Subject to any disclaimer, the term of this patent is extended or adjusted under 35 U.S.C. 154(b) by 9 days.

(21) Appl. No.: 10/633,602

(22) Filed: Aug. 4, 2003

(65) Prior Publication Data

US 2005/0032004 A1 Feb. 10, 2005

(51) Int. Cl.
*G03F 9/00* (2006.01)

(52) U.S. Cl. .......... 430/30; 430/311; 382/144
(58) Field of Classification Search .......... 430/30, 430/331; 382/144
See application file for complete search history.

(56) References Cited

U.S. PATENT DOCUMENTS

| 6,143,473 | A | * | 11/2000 | Hoshino et al. | 430/296 |
| 6,200,736 | B1 | * | 3/2001 | Tan | 430/319 |
| 6,303,931 | B1 | * | 10/2001 | Menaker et al. | 250/307 |
| 6,641,975 | B2 | * | 11/2003 | Takeda et al. | 430/270.1 |

* cited by examiner

*Primary Examiner*—Christopher G. Young
(74) *Attorney, Agent, or Firm*—I. Zborovsky

(57) ABSTRACT

A method of controlling removal of photoresist in openings of a photoresist mask has the steps of obtaining in a scanning electron microscope a video signal of a bottom of an opening of a photoresist mask, and comparing values of the video signal in different points of an image which contains the opening to be controlled.

9 Claims, 2 Drawing Sheets

A block diagram illustrating a sequence of actions during performing the inventive method for controlling a completeness of removal of a resistive layer in narrow openings-windows of a photoresist layer A view schematically showing a scan electron microscope image of a structure which contains a round opening.
1 is a microscope field of view; 2 is a bottom of the opening; 3 are islands of non-removed photoresist; 4 are image fragments for video-signal mean value SF calculation; 5 is a portion of field of view for mean square amplitude of noises N calculation.

METHOD OF CONTROLLING REMOVAL OF PHOTORESIST IN OPENINGS OF A PHOTORESIST MASK

BACKGROUND OF THE INVENTION

The present invention relates to a method for controlling completeness of removal of a photoresist layer in openings, in particular in round, substantially closed openings of a photoresist mask.

In the field of control of results of lithographic processes, a control of completeness of development of a photoresist layer is not yet solved, as specified for example in A. Starikov, K. W. Tobin, "EM review and discrete inspection of pptically invisible defects in a production environment", Proc. SPIE Vol. 4692, pp. 162–167, 2002; and H. Nishiyama, M. Nozoe, K. Aramaki, O. Watanabe, and Y. Ikeda, "Open-Contact-Failure Detection of via Holes by Using Voltage Contrast", Proceeding of SPIE, 4344, pp. 12–21, 2001. Incomplete removal of the photoresist in the openings or "windows" of a photoresist mask leads to rejects in the manufacture of integrated circuits, to reduction of yield of articles, and therefore to substantial worsening of efficiency of operation of facilities which produce microelectronic devices. This problem is resolved nowadays by accurate selection of modes of exposition and development of photoresist during adjustment of technological processes of lithography. During the adjustment, in order to control the completeness of development, various methods for determination of a residual layer of photoresist on a bottom part of the "window" of the photoresist mask are utilized. Mainly, these methods are used in condition "out of fab", they are not related to the group of so-called "non destructive" methods, and they are realized in R&D departments outside of the main technological process production of microelectronic devices. From economical point of view, the control of completeness of development is frequently performed not on the working wafers, but instead on specially made test modules and wafers, which makes difficult to use the thusly made conclusions for real products.

The above mentioned difficulties are especially pronounced when the control for completeness of development of a photoresist in the "contact windows" has to be performed in the windows which are formed as round openings with a small size in the photoresist layer. The reason is the differences in kinetics of development of photoresist in narrow and broad "slots" or in broader "windows" of the photoresist mask. Theoretically it is understood and experimental it is proven that the conditions for complete removal of the photoresist in the narrow round openings do not correspond to those for the system of strips of the same size, or for larger round and other windows in the photoresist layer. It is therefore necessary to develop a method for controlling the completeness of removal of photoresist in contact windows of small sizes on the working plates or wafers in condition of the mass production of the microelectronic articles. It should be mentioned that the incompletely removed photoresist layer on the bottom part of the opening has an island structure. This is caused by many reasons, and the main reasons are micro-inhomogenuity of the properties of the photoresist, and in particular of the kinetics of its development in narrow openings.

An attempt to solve this problem is described in S. Majoni, I. Englard, "CD-SEM-Based Metrology for Contact Lithographcy and Etch Control", *Semiconductor International*, Apr. 1, 2003. In this attempt a correlation between the completeness of removal of photoresist in the "contact window" and the shape of inclination (side wall) of this window was determined. A greater completeness of removal of photoresist allegedly corresponds to the steeper inclines. A quantitative criterium (profile grade-PG) is presented which allows classification of all possible cases occurring in practice. In accordance with this reference, the case 0<PG<1.4 corresponds to the bottom of the "window" completely covered by resist (closed). If 1.4<PG<1.7, then the resist layer in the "window" is removed incompletely (semi-opened). The value 1.7<PG<5 corresponds to the complete removal of the photoresist layer (fully opened).

In addition to arbitrary selection of the numeric borders and conditional nature of the determined "closed", "semi-opened" and "fully opened" situations, the proposed method suffers from the fact that a method of calculation of the criteria PG is not disclosed. The calculations of the value PG on a picture of the cross-section of the wafer is not advisable, since it presupposes the destruction of the expensive object of control. The authors recommend to use a scan electron microscope, and in particular "the secondary electron intensity waveform to determine the profile of a contact". However, it is well known that the secondary electron intensity waveform in the electron microscope never coincides with a geometry of the object, and there is no fully determined connection between these characteristics. The secondary electron intensity waveform depends significantly not only on the geometry of the object, but also on its properties (composition), and also on the characteristics of the used electron microscope: its resolution, accelerating voltage, type of detector of secondary electrons, value of a working distance, level of noise in a video signal, etc. Correspondingly, when the object of control is changed and the type of the microscope and parameters of its operation are changed, inevitably the values PG calculated from the analysis of the shape of the video signal will change as well. Therefore, the problematic correlation between the structure of the side wall and the completeness of removal of the resist layer on the bottom of the "contact windows" becomes even less accurate, in the case if as it is recommended in this reference, the key value of the parameter PG is calculated from the shape of the video signal. Finally, it seems unnatural and therefore inefficient when a conclusion about the properties of one object, namely the bottom of the opening, is made based on the results of the other object, namely the wall of this opening.

U.S. Pat. No. 6,303,931, proposes a method which is substantially similar to the method presented immediately herein above. An approximation is used of the video signal obtained in the experiment with a certain analytical curve, or a power function of the type:

$$y(x) = (y_2 - y_1) \frac{\left|\frac{x - x_0}{x_1 - x_0}\right|^n}{\left|\frac{x_2 - x_0}{x_1 - x_0}\right|^n} + y_1$$

wherein the function y(x) reflects the dependency of the value of the video signal (y) from the coordinate x along the line of scanning, $x_0$, is a position of the central minimum on the video signal, $x_1$ and $x_2$ are points on the left and right inclines of the video signal selected, for example as the points where a derivative of the video signal is maximal, $y_1$ and $y_2$ are values of the video signal in the points $x_1$ and $x_2$ correspondingly. The parameter n which has a key value is determined during the procedure of approximation of a set of values of the video signal with the above mentioned analytical curve.

This method also has substantial disadvantages which in some cases will lead to significant errors, or to the situation that it does not work at all. In a typical case when the central minimum (coordinate $x_0$) is located at equal distances from the selected points $x_1$ and $x_2$, in the denominator of the fraction under the sign of the module exactly one is obtained, and the whole denominator will be equal to zero, and therefore it will become impossible to calculate the approximated function and the key value of the parameter n. In another example, if in the selected points on the inclines $x_1$ and $x_2$ the values of the video signal $y_1$ and $y_2$ are equal, then the first multiplier before the fraction in the formula will be equal to zero. Therefore the whole first adding element will become equal to zero, and the dependency y from x will no longer exist. This also will make impossible the determination of the value n. Also, another example can be presented. During evaluation of possibilities and limitations of the method it has to be taken into consideration that the video signal always have noises. It is shown in practice that the ratio signal/noise (S/N) is small and seldom exceeds the value 10. Since the noise of video signal has a statistic nature, it can be said that the value of the video signal measured in the experiment in any point of measurement is a random value, and in accordance with the statistic laws, with the probability 68% it does not go beyond the interval from $S_{AVE}-N$ to $S_{AVE}+N$, wherein N is a mean square value of the noise, and $S_{AVE}$ is a mean value of the signal averaged over many realizations. This is applicable also to the points $x_1$ and $x_2$. As a result, the difference $y_2-y_1$ due to random reasons can also assume the value from zero to 2N. Since in the above mentioned formula this difference is a comultiplier, the calculation of the key parameter n becomes a very unstable procedure. If a signal from the same object is determined twice, then the value $y_2$ and $y_1$ in the above mentioned points will be different (due to the contribution of statistic noises, which inevitably will lead to different values of the parameter n).

Finally, the authors ignore the dependency of the steepness of the profile in the video signal, and therefore of the parameter n from the diameter of the beam of primary electrons which scan the sample, and also the dependency of the shape of the profile from the ratio of the diameter of the openings to its depth. These ratios which are not taken into consideration, lead in practice to an additional ambiguity during the calculation of n.

SUMMARY OF THE INVENTION

Accordingly, it is an object of the present invention to provide a method of controlling completeness of removal of photoresist in contact windows of a photoresist mask which can be performed in the manufacturing conditions and eliminates the above mentioned disadvantages.

In keeping with these objects and with others which will become apparent hereinafter, one feature of the present invention resides, briefly stated, in a method of controlling removal of photoresist in openings of a photoresist mask, comprising the steps of obtaining in a scanning electron microscope a video signal of a bottom of an opening of a photoresist mask; and comparing values of the video signal in different points of an image which contains the opening to be controlled.

When the method is performed in accordance with the present invention, it is easy to combine with a standard method of measurements of the sizes in a scan electron microscope, since for controlling the completeness of removal of a resistive layer it is not necessary to perform a special experiment: the calculations are performed on the same scan electron microscope image which is accumulated and kept in the memory of the computer during measurements of sizes of the contact windows.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
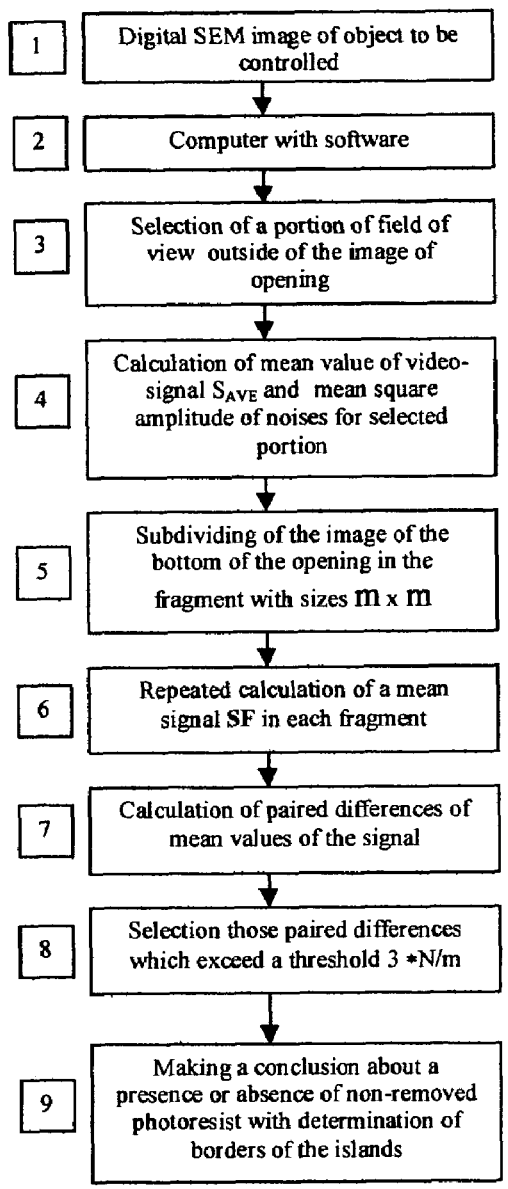
FIG. 1 is a view showing a block diagram illustrating a sequence of actions during performing the inventive method for controlling a completeness of removal of a resistive layer in narrow openings-windows of a photoresist layer.

For controlling a completeness of removal photoresist in openings of a photoresistive mask a method is proposed which is realized in a scanning electron microscope. It is based on comparison of values of a video signal of a bottom of an opening of a photoresist mask obtained of a scanning electron microscope in different points of an image which contains an opening to be controlled.

In order to perform the control of completeness of removal of photoresist, first a portion 5 of a field of view 1 is selected outside of the image of a contact window 2. The size of the selected portion has to be preferably not less than 10×10 pixels. Then, an average value $S_{AVE}$ of a signal S is calculated on the selected portion in accordance with the formula:

$$S_{AVE} = \frac{\sum_{i=1}^{n} S(i)}{n}$$

where i is a pixel number, n is a number of pixels involved in the calculation, and $S_{(i)}$ is an individual value of the video signal.

Then, a mean square amplitude of the noise N is calculated in accordance with the formula:

$$N = \frac{1}{\sqrt{n}} \sqrt{\sum_{i=1}^{n} [S(i) - S_{AVE}]^2}$$

In the area of image of a bottom a small fragment 4 is selected with the size m×m pixels, wherein m can be 3–10 and a full quantity of pixels contained in the fragment is $m^2$.

An average value of the video signal along the selected fragment SF(1) is then calculated in accordance with the following formula:

$$SF(1) = \frac{1}{m^2} \sum_{j=1}^{m^2} S(j)$$

A next fragment is selected in the area of image of the bottom, which does not interfere with the previous segment, in accordance with the same principle, and the average value of the signal in this second fragment SF(2) is calculated in the same way.

After this new fragments are selected and new calculations are performed of SF(3), SF(4) . . . SF(k) until all fragments will cover the image of the bottom of the opening.

Then paired differences of the average values of the video signals are calculated, such as: SF(1)–SF(2), SF(2)–SF(3), . . . SF(k–1)–SF(k).

The values of the paired differences are compared for determination and localization of islands of the non-removed resist 3, with an expected value of fluctuation of background FF equal:

$$FF = 3\frac{N}{m}$$

If any of the paired differences has an absolute value exceeding the value FF, then on the bottom of the opening there are non-removed islands of the photoresist and a border of the photoresist island 3 extends between the fragments which form this paired difference.

In accordance with the present invention, in order to increase sensitivity of determination of the non-removed photoresist layer, a scan electron microscope image is used, which is obtained in the scan electron microscope at a reduced accelerating voltage.

The inventive method is based on the concept that the value of the video signal from a bare portion of the bottom of the opening always differs from a signal corresponding to the portion of the bottom which is covered by a residual layer of the photoresist. These differences are caused by differences in the nature of the surface on its portions (so-called "composition contrast" in the scan electron microscope), by the presence of a relief of the island structure of the resistive layer ("topographic contrast" in the scan electron microscope), and by differences in electrical conductivity of the photoresist and the material of the bottom of the openings ("volt contrast" in the scan electron microscope).

The process for controlling of completeness of removal of the photoresist layer includes the following procedure.

Figure 2:
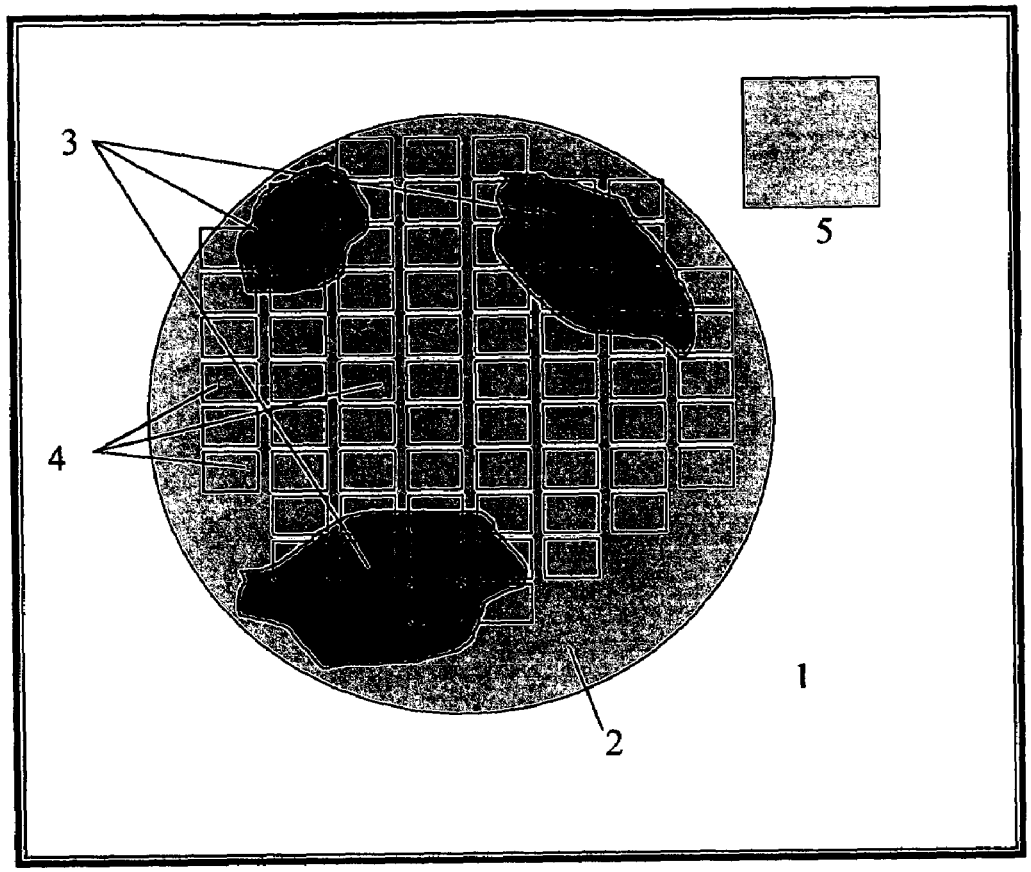
FIG. 2 is a view schematically showing a scan electron microscope image of a structure which contains a round opening.

In order to perform the control, a computer which is provided with a program realizing the above mentioned algorithm is utilized. A digital file or image of the structure which contains the opening to be controlled is introduced at the input of this program. The file is obtained usually in a scan electron microscope during measurements of sizes of the opening. It is desirable to provide a magnification of the microscope so that this image occupies a significant part of a field of view of the microscope: from $\frac{1}{10}$ to $\frac{1}{2}$. This condition is not strict, it is usually selected during measurements of the sizes. As mentioned above, on the periphery of the field of view of the microscope a portion with the size not less than 10×10 pixels is selected, which portion does not have any structural details. An average value of the signal $S_{AVE}$ is calculated on this portion, and a mean square amplitude of the noise N is calculated as well. The thusly obtained value of the amplitude of the noise is extremely important for the subsequent detection of the presence of islands of photoresist on the bottom of the opening. Then, the analysis of distribution of signal over a field of view of the bottom part of the opening is performed. For this purpose, sizes of the fragments are determined (given by an operator)—a constant m, and the image of the bottom portion of the opening is subdivided into k similar segments as shown in FIG. 2. In each segment an average value of the signal SF is calculated. It is to be understood that due to natural noises of the video signal, these average values SF are slightly different, even if the bottom of the opening does not have traces of photoresistive islands. In order to avoid faulty conclusions, the presence of photoresistive structures is considered to take place only in those pairs of fragments, where the average value of signal is different more than it can be caused by natural noises. The statistic nature of the noises allows to formulate a practical evaluation of probability of control: with the probability about 99.5% to segments which have different average values of video signals more than 3*N/m must be considered as statistically different, and these differences can not be caused by noises. They have to be caused by differences in nature and geometry of the corresponding portions of the bottom of the opening. The border of the photoresist island in the bottom of the opening is therefore localized between the fragments which show the differences in the average values of the signal SF exceeding the value 3*N/m.

It will be understood that each of the elements described above, or two or more together, may also find a useful application in other types of methods differing from the types described above.

While the invention has been illustrated and described as embodied in a method of controlling removal of photoresist in openings of a photoresist mask, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is:

1. A method of making a conclusion about a presence or absence of photoresist in openings of a photoresist mask, comprising the steps of obtaining in a scanning electron microscope a video signal of a bottom of an opening of a photoresist mask; and comparing values of the video signal in different points of an image which contains the opening, wherein said comparing includes selecting a portion of a field of vision outside of an image of the opening; determining a mean value of the video signal and a mean square amplitude of noise on the selected portion; subdividing the image of the bottom of the opening into fragments; repeating calculations of a mean signal in each fragment; calculating paired differences of average values of the signal; selecting those paired differences which exceed a threshold; and making a conclusion about a presence or absence of non-removed photoresist with determination of borders of the islands.

2. A method as defined in claim 1, wherein the selecting the portion of the field of vision outside of the image of the opening is performed with a size of the portion not less than 10×10 pixels.

3. A method as defined in claim 1, wherein determining the mean value of the video signal on the selected portion is performed in accordance with the formula:

$$S_{AVE} = \frac{\sum_{i=1}^{n} S(i)}{n}$$

wherein i is a number of pixel, n is a number of pixels involved in the calculation of the mean signal, and S(i) is an individual value of the video signal.

4. A method as defined in claim 1, wherein the determining the mean square amplitude of noises N is performed in accordance with the formula:

$$N = \frac{1}{\sqrt{n}} \sqrt{\sum_{i=1}^{n} [S(i) - S_{AVE}]^2}.$$

5. A method as defined in claim 1, wherein the subdividing of the image of the bottom of the opening in the fragment is performed with the selection of the fragments sizes m×m, wherein m is 3–10, and a number of pixels in the fragment is $m^2$.

6. A method as defined in claim 1, wherein the calculating of a mean value of the video signal in the fragment is performed in accordance with the formula:

$$SF(k) = \frac{1}{m^2} \sum_{j=1}^{m^2} S(j).$$

7. A method as defined in claim 1, wherein the repeated calculating a mean signal in each fragment is performed until all fragments cover the image of the bottom of the opening.

8. A method as defined in claim 1, making a conclusion about presence of islands of non-remote resist by comparison of the paired differences with an expected fluctuations of background $$FF = 3\frac{N}{m}.$$

9. A method as defined in claim 1; and further comprising the image obtained in the scan and electron microscope obtaining at a reduced accelerating voltage, in order to increase sensitivity of determination of the non-removed photoresist layer.

* * * * *